United States Patent [19]

Ando et al.

[11] Patent Number: 5,023,688
[45] Date of Patent: Jun. 11, 1991

[54] TRANSFER GATE WITH THE IMPROVED CUT-OFF CHARACTERISTIC

[75] Inventors: Kaz... sa Ando, Kawasaki; Hideo Sakai, Yokohama; Miki Sakai, Kitakami, all of Japan

[73] Assignee: Kabushiki Kaisha Toshiba, Kawasaki, Japan

[21] Appl. No.: 447,063

[22] Filed: Dec. 7, 1989

[30] Foreign Application Priority Data

Dec. 15, 1988 [JP] Japan .................. 63-317105

[51] Int. Cl.$^5$ .................. H01L 27/02; H03K 3/26; H03K 17/16; H03K 17/687
[52] U.S. Cl. .................. 357/42; 357/45; 307/279; 307/443; 307/572
[58] Field of Search .................. 307/577, 572, 279, 443, 307/446; 357/42, 45

[56] References Cited

U.S. PATENT DOCUMENTS 4,511,814 4/1985 Matsuo et al. .................. 307/502

FOREIGN PATENT DOCUMENTS 0158292 10/1985 European Pat. Off. .................. 357/42

*Primary Examiner*—Rolf Hille
*Assistant Examiner*—Mahshid Saadat
*Attorney, Agent, or Firm*—Finnegan, Henderson, Farabow, Garrett and Dunner

[57] ABSTRACT

A transfer gate is made up of at least two p-channel MOS FETs and at least two n-channel MOS FETs. The current paths of the n-channel MOS FETs are connected in series, and the conduction of the FETs is controlled by a first control signal applied to the gates thereof. The current paths of the p-channel MOS FETs are also connected in series, and the conduction of the FETs is controlled by a second control signal applied to the gates thereof. The first and second control signals are opposite phase. The series circuit of the current paths of the p-channel FETs is connected in parallel to the series circuit of the current paths of the n-channel FETs. The p-channel FETs are formed in at least two n-type well regions, which is formed in the major surface region of a p-type semiconductor substrate at different locations separated from each other by predetermined distances.

4 Claims, 7 Drawing Sheets

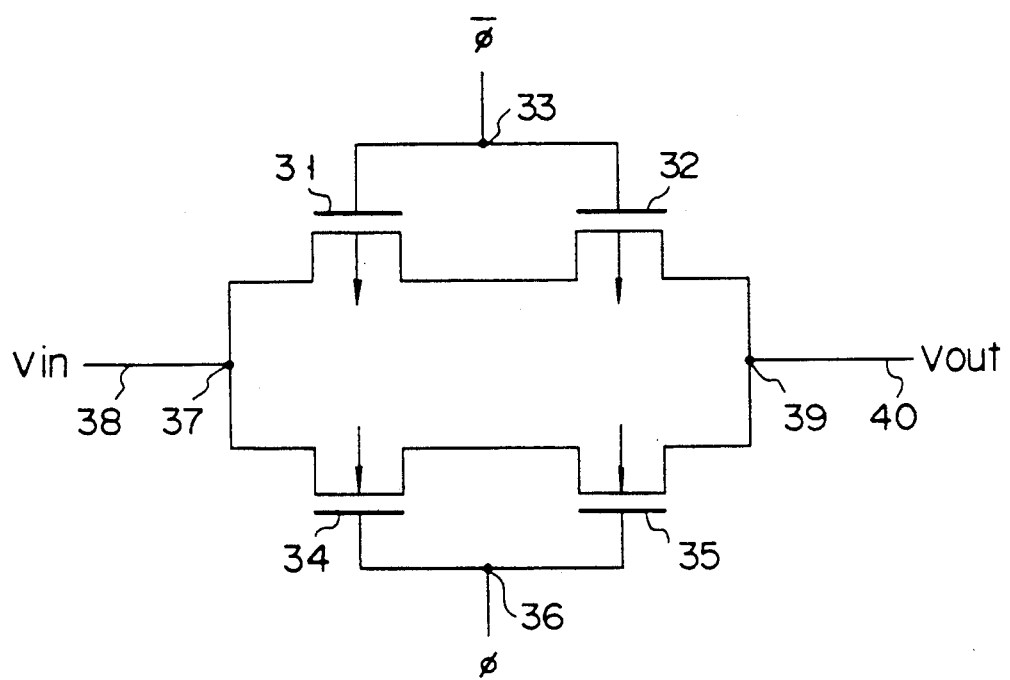
F I G. 3

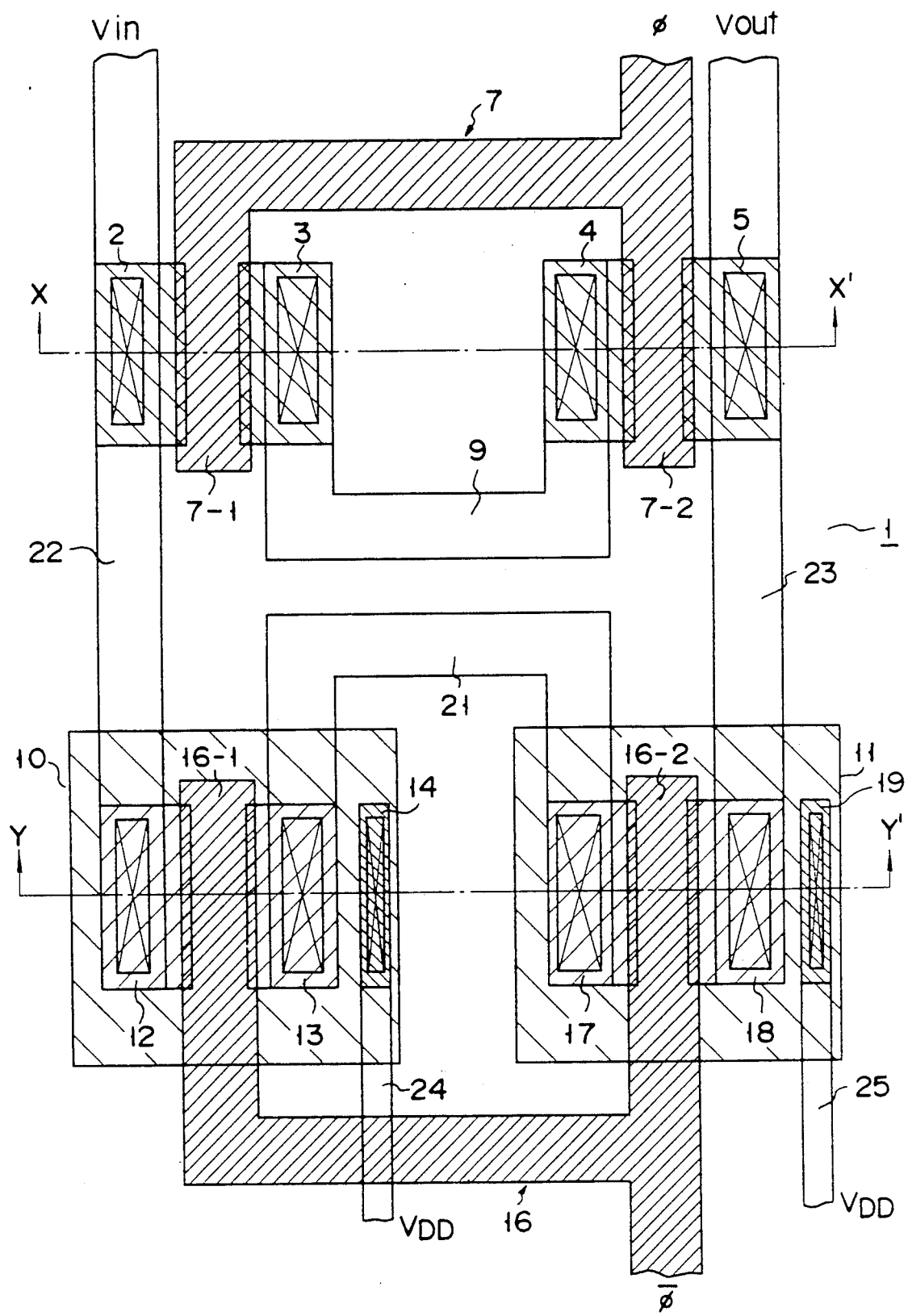
F I G. 4A

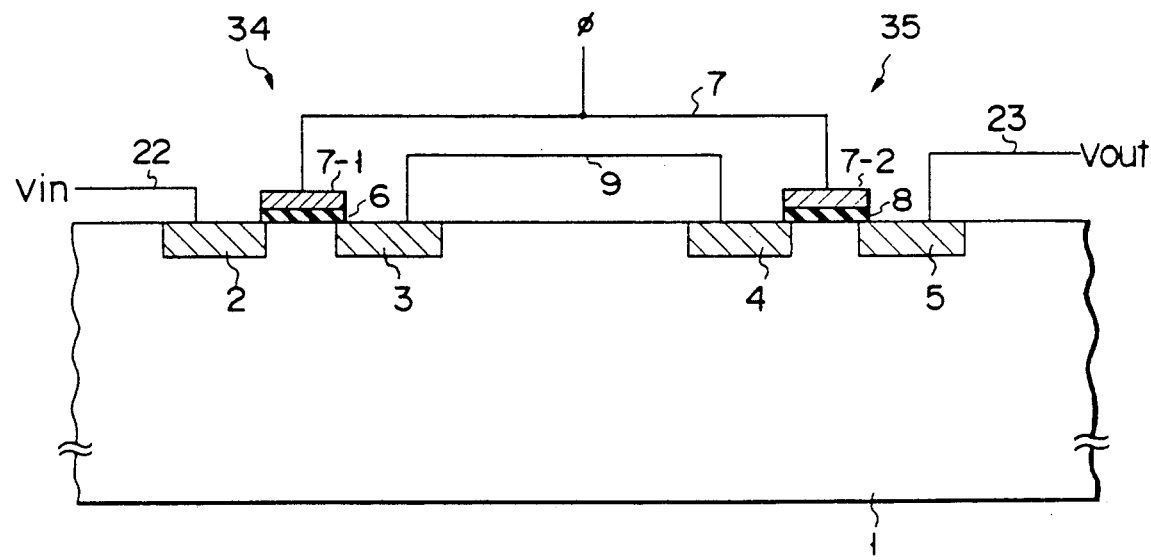
F I G. 4B
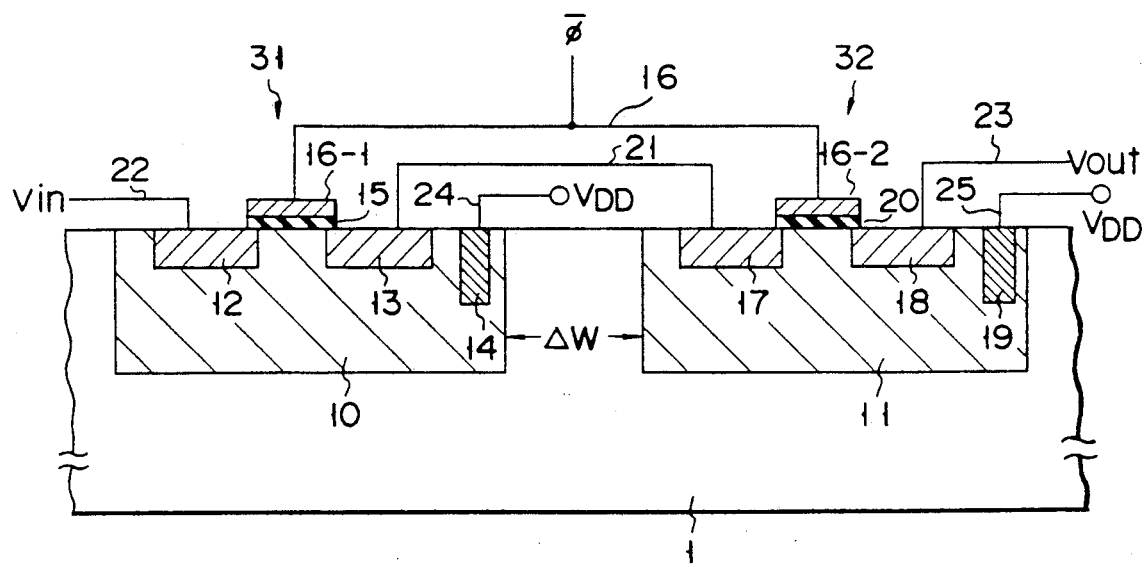
F I G. 4C

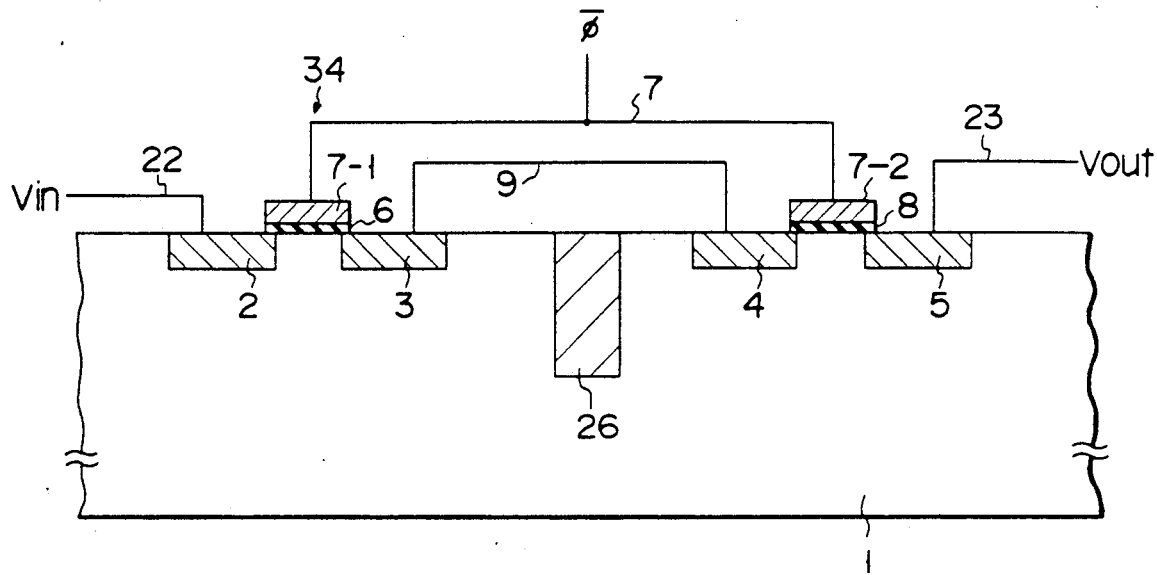
F I G. 5B
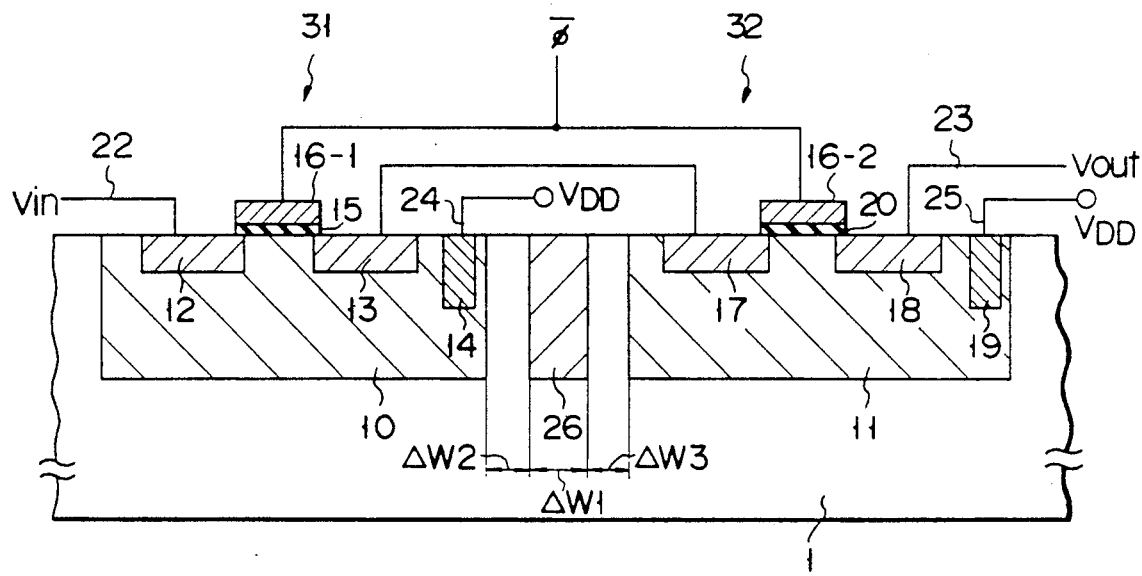
F I G. 5C

TRANSFER GATE WITH THE IMPROVED CUT-OFF CHARACTERISTIC

BACKGROUND OF THE INVENTION

1. Field of the Invention

The present invention relates to a transfer gate, and more particularly to a transfer gate suitable for an analog switch of the MOS-IC.

2. Description of the Related Art

FIG. 1 shows a circuit diagram of a conventional transfer gate. In the circuit, the current paths of a p-channel MOS FET 41 and an n-channel MOS FET 42 are connected in parallel. For conduction control of those FETs, a gate signal $\phi$ is applied to the FET 42, and a gate signal $\bar{\phi}$, which is opposite phase with respect to the gate signal $\phi$, is applied to the gate of the FET 41. When the gate signal $\phi$ is in a $V_{SS}$ level and the gate signal $\bar{\phi}$ is in a $V_{DD}$ level, one of the FETs is in an on state irrespective of the level of an input signal Vin applied to an input node 43. Because the combined resistance of the FETs 41 and 42 is very low, if the input signal Vin swings between the voltages $V_{SS}$ and $V_{DD}$, the transfer gate is able to transfer the input signal from the input node 43 to an output node 44, while keeping the voltage level of the input signal substantially constant. The output signal of the transfer gate is denoted as Vout. Consider a case that the gate signal $\bar{\phi}$ is in a $V_{DD}$ level and the gate signal $\phi$ is in a $V_{SS}$ level, both the FETs 41 and 42 are in an off state. In this case, the combined resistance of the FETs 41 and 42 is apparently infinity. Accordingly, the transfer gate is unable to transfer the input signal to the output node 44. Because the transfer gate has such a characteristic, the transfer gate shown in FIG. 1 is used mainly as the analog switch of the MOS-IC.

FIG. 2 is a cross sectional view showing the structure of the p-channel MOS FET 41, one of the MOS FETs forming the transfer gate. An n-type well region 52 is formed in a major surface region of a p-type silicon substrate 51. A p-type source region 53, a p-type drain region 54, and an n-type sub-region 55, which are formed in the surface region of the n-type well region 52, are separated from one another by predetermined distances. A gate insulating film 60 is formed on the surface of the substrate 51 (well region 52), while being located between the source and drain regions 53 and 54. A source wire 56 serving as the input node 43 shown in FIG. 1 is led from the source region 53, and a drain wire 57 serving as the output node 44 is led from the drain region 54. The sub-region 55 is for applying a predetermined bias voltage to the well region 52, has an impurity concentration higher than the well region 52, and is connected to the power source $V_{DD}$.

The transfer gate containing the p-channel MOS FET 41 thus structured involves the following problem. When the transfer gate is in a cut-off state, viz., the FETs 41 and 42 are both in an off state, if a voltage higher than a predetermined voltage (between the voltages $V_{SS}$ and $V_{DD}$) is applied to the input node 43, the potential at the output node 44 varies. In the transfer gate being in an off state, when the voltage higher than the predetermined voltage is applied to the source wire 56 (input node 43), this high potential is applied to the source region 53. As a result, the source region 53 and the well region 52 are forwardly biased, so that the potential in the well region 52 rises. In turn, the well region 52 and the drain region 54 are reversely biased, so that a depletion layer 59 is generated in the junction between the well region 52 and the drain region 54. As known, the depletion layer 59 is a high resistance region, and shuts off the current flow. When the depletion layer 59 is produced, an imaginary capacitor is brought about (the imaginary capacitor being referred to as a depletion layer capacitor hereinafter). Under this condition, if an alternately varying signal or noise enters the source wire 56 (input node 43), the depletion layer capacitor capacitively couples the well region 52 with the drain region 54. Consequently, the potential of the drain wire 57 (output node 44) varies. As already stated, this type of the transfer gate is generally applied to an analog switch in the MOS-IC. In this case, a plurality of transfer gates are coupled in a parallel fashion. In a specific condition, one of those transfer gates is selected and turned on, while the remaining ones being turned off. Under this condition, if the alternately varying signal enters the input nodes of the transfer gates being in an off state, there is highly probable that the potentials at the output node of the off-state gates vary. A slight variation of the potential at the output node, if occurs, has an adverse effect on the operation of the circuit containing those gates. This is the problem to urgently be solved.

SUMMARY OF THE INVENTION

Accordingly, an object of the present invention is to provide a transfer gate with such a structure that where a high voltage in excess of a rated voltage is applied to the input node of the transfer gate being in an off state, even if an alternately varying voltage or noise enters the input node, a voltage variation at the input node will never be transferred to the output node.

To achieve the above object, there is provided a transfer gate comprising a semiconductor substrate of a first conductivity type; a plurality of well regions of a second conductivity type formed in a major surface region of the semiconductor substrate at different locations separated from each other by predetermined distances; and a MOS FET formed in each of the well regions, the current paths of the MOS FETs being connected in a series fashion, and the conduction of the MOS FETs being controlled by a control signal applied to the gates of the MOS FETs.

With such a structure, the conduction of the MOS FETs is simultaneously controlled by the control signal. A signal applied to one end (input node) of the series path consisting of the current paths of the MOS FETs, is transferred to a the other end (output node) of the series path. In a practical use, a situation will frequently be encountered in which the transfer gate is in an off state, a high voltage in excess of a specific range of voltage from $V_{SS}$ to $V_{DD}$ is applied to the transfer gate, and an alternately varying signal or noise is further applied to the gate. In such a situation, the drain potential of the MOS FET closest to the input node of the transfer gate varies, as in the convention transfer gate. It is noted, however, that as the voltage variation propagates through the series path, it is progressively and gradually attenuated and can hardly reach the output node.

Thus, the voltage variation at the input node of the transfer gate that occurs in the above situation will never be transferred to the output node.

BRIEF DESCRIPTION OF THE DRAWINGS

FIG. 3 is a circuit diagram showing a transfer gate according to a first embodiment of the present invention;

FIG. 4A is a plan view showing a pattern of the transfer gate structured as shown in FIG. 3;

FIG. 4B is a sectional view taken on line X-X' in FIG. 4A;

FIG. 4C is a sectional view taken on line Y-Y' in FIG. 4A;

FIG. 5B is a sectional view taken on line X-X' in FIG. 5A;

FIG. 5C is a sectional view taken on line Y-Y' in FIG. 5A; and

DETAILED DESCRIPTION OF THE PREFERRED EMBODIMENTS

Figure 1:
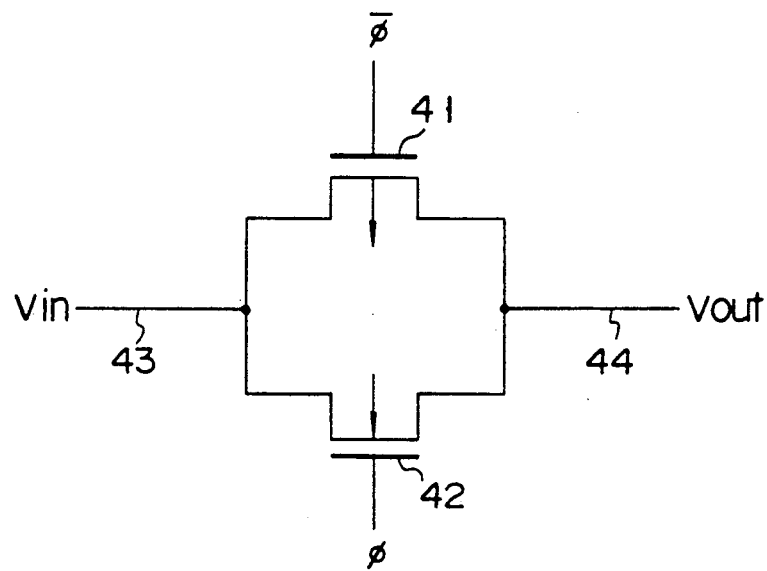
FIG. 1 is a circuit diagram showing a conventional transfer gate.
Figure 2:
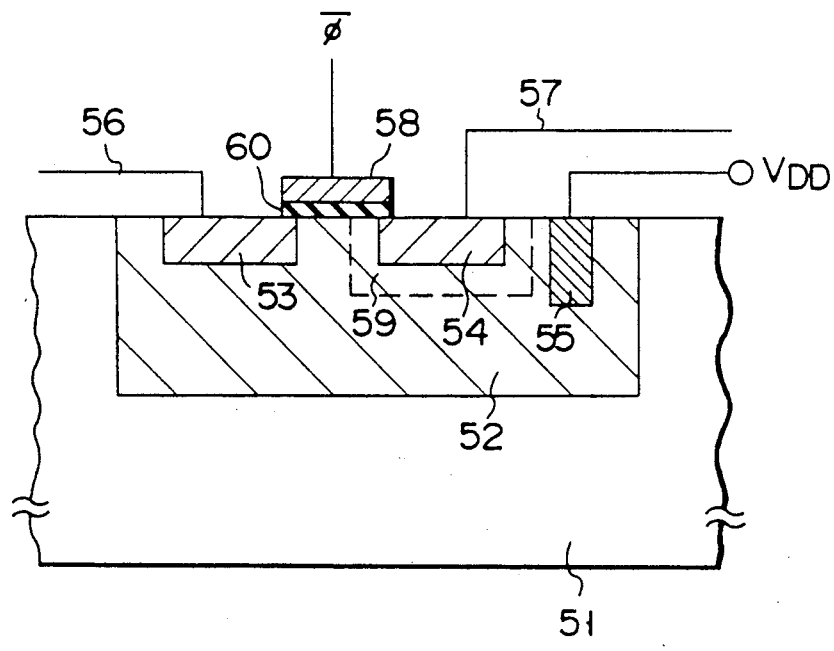
FIG. 2 is a sectional view showing the structure of a p-channel MOS FET used in the transfer gate of FIG. 1.

FIG. 3 shows a circuit diagram of a transfer gate according to a first embodiment of the present invention. As shown, a couple of p-channel MOS FETs 31 and 32 are connected such that the current paths of the FETs are connected in series, and the gates of them are connected together at a node 33. A couple of n-channel MOS FETs 34 and 35 are connected such that the current paths of the FETs are connected in series, and the gates of them are connected together at a node 36. The sources of the FETs 31 and 34 are connected together at a node 37 leading to an input node 38. The drains of the FETs 32 and 35 are connected together at a node 39 leading to an output node 40. For controlling the operation of the transfer gate, a gate signal $\bar{\phi}$ is applied to the node 33, and a gate signal $\phi$ is applied to the node 36. An input signal Vin is applied to the input node 38. The input signal Vin passes through a series path of the current paths of the FETs 31 and 32, which are coupled in parallel, and another series path of the current paths of the FETs 34 and 35, which are coupled in parallel, and is outputted from the output node 40, as an output signal Vout with a voltage level comparable with that of the input signal Vin.

An operation of the transfer gate will be described hereinafter. When the gate signal $\bar{\phi}$ is in a $V_{SS}$ level and another gate signal $\phi$ is in a $V_{DD}$ level, the FETs contained in at least one of the pairs of the FETs 31 and 32 and the FETs 34 and 35 are turned on irrespective of the level of the input signal Vin. Thus, since under the above condition, the paired FETs 31 and 32 and/or the paired FETs 34 and 35 are conductive, the transfer gate is placed in an on state. Accordingly, the input signal Vin at the input node 38 is transferred through the transfer gate and appears at the output node 40, as the output signal Vout. On the other hand, when the gate signal $\bar{\phi}$ in a $V_{DD}$ level and another gate signal $\phi$ is in a $V_{SS}$ level, all of the FETs 31, 32, 34 and 35 are turned off. Under this condition, the transfer gate is in an off state, to prohibit the transfer of the input signal therethrough.

FIG. 4A is a plan view showing a pattern of the transfer gate structured as shown in FIG. 3. FIG. 4B is a sectional view taken on line X-X' in FIG. 4A. FIG. 4C is a sectional view taken on line Y-Y' in FIG. 4A. In the illustration of FIG. 4B and 4C, the structure of the MOS FETs is elaborated, but the wires on the upper layers are indicated by mere solid lines, for simplicity.

As shown, in the major surface regions of a p-type silicon substrate 1, an n-type source region 2 and an n-type drain region 3, which are for the n-channel MOS FET 34, are formed and separated from each other by a predetermined distance. Similarly, an n-type source region 4 and an n-type drain region 5, which are for the n-channel MOS FET 35, are formed therein with a predetermined distance between them. A gate insulating film 6 is formed at a location on the surface of the substrate 1 where is between the source and the drain regions 2 and 3. A gate electrode 7-1 is further formed on the insulating film 6. Similarly, a gate insulating film 8 is formed at another location on the surface of the substrate 1 where is between the source and the drain regions 4 and 5. A gate electrode 7-2 is further formed on the insulating film 8. A single layer 7 of, for example, polysilicon, as patterned as shown in FIG. 4A, is used for those gate electrodes 7-1 and 7-2.

The gate signal $\phi$ is applied to the gate electrode pattern 7. The drain region 3 of the FET 34 and the source region 4 of the FET 35 are interconnected by a wire 9 as a layer of aluminum, for example.

Further formed in the major surface region of the substrate 1 are first and second n-type well regions 10 and 11, which are separated from each other by a predetermined distance. The MOS FET 31 is formed in the first well region 10, and the MOS FET 32, in the second well region 11. A distance $\Delta W$ separating the well regions 10 and 11 must be long enough to electrically insulating the FETs 31 and 32, e.g., 10 $\mu$m.

Formed in the surface region of the first well region 10 are a p-type source region 12, a p-type drain region 13, and an n-type sub-region 14, which are separated from one another by predetermined distances. A ate insulating film 15 is formed at a location on the surface of the substrate 1 where is between the source and the drain regions 12 and 13. A gate electrode 16-1 is further formed on the insulating film 15. Similarly, formed in the surface region of the second well region 11 are a p-type source region 17, a p-type drain region 18, and an n-type sub-region 19, which are separated from one another by predetermined distances. A gate insulating film 20 is formed at a location on the surface of the substrate 1 (well region 11) where is between the source and the drain regions 17 and 18. A gate electrode 16-2 is further formed on the insulating film 20. A single layer 16 of, for example, polysilicon, as patterned as shown in FIG. 4A, is used for those gate electrodes 16-1 and 16-2. The gate signal $\bar{\phi}$ is applied to the gate electrode pattern 16. The drain region 13 of the FET 31 and the source region 17 of the FET 32 are interconnected by a wire 21 as a layer of aluminum, for example. A source wire 22 connects the source regions 12 of the FET 31 with the source region 2 of the FET 34. The input signal Vin is applied to the source wire 22. The drain regions 18 and 5 of the FETs 32 and 35 are wired by a drain wire 23. The output signal Vout is derived from the drain wire 23. For the application of a bias voltage, the power source $V_{DD}$ is applied through wires 24 and 25 respectively to the sub-regions 14 and 19.

Consider a case that the transfer gate thus structured is in an off state, a voltage suddenly changes, and a high voltage above a powersource voltage $V_{DD}$ is applied to the source wire 22. In this case, a forward bias voltage is applied between the source region 12 and the well region 10 of the FET 31. A potential in the well region 10 rises. A reverse bias voltage is applied to between the well region 10 and the drain region 13, so that a depletion layer capacitor is formed at the junction between the regions 10 and 13. Under this condition, if an alternately varying signal or noise enters the input node (source wire 22) of the transfer gate, the depletion layer capacitor capacitively couples the input signal Vin with the drain region 13, to change a potential on the wire 21 coupled with the drain region 13. The potential change in the wire 21 is transferred to the source region 17 of the FET 32. It is noted, however, that the voltage change, after propagating through the current path of the FET 31, is attenuated to such a potential as to fail to rise a potential in the well region 11 containing the FET 32. Therefore, there is no change of the potential of the drain wire 23 of the FET 32.

Thus, when a high voltage out of the range between $V_{SS}$ and $V_{DD}$ is applied to the input node 38 of the transfer gate being in an off state, and an alternately varying signal or noise is applied to the gate, a voltage change at the input node 38 is not transferred to the output node 40. As already stated, this type of the transfer gate is generally applied to an analog switch in the MOS-IC. In this case, a plurality of transfer gates are coupled in a parallel fashion. In a specific condition, one of those transfer gates is selected and turned on, while the remaining ones being turned off. In such a case, use of the transfer gates according to the present invention guarantees the correct operation of the circuit containing the gates.

A second embodiment of the present invention will be described with reference to FIGS. 5A through 5C.

Figure 5A:
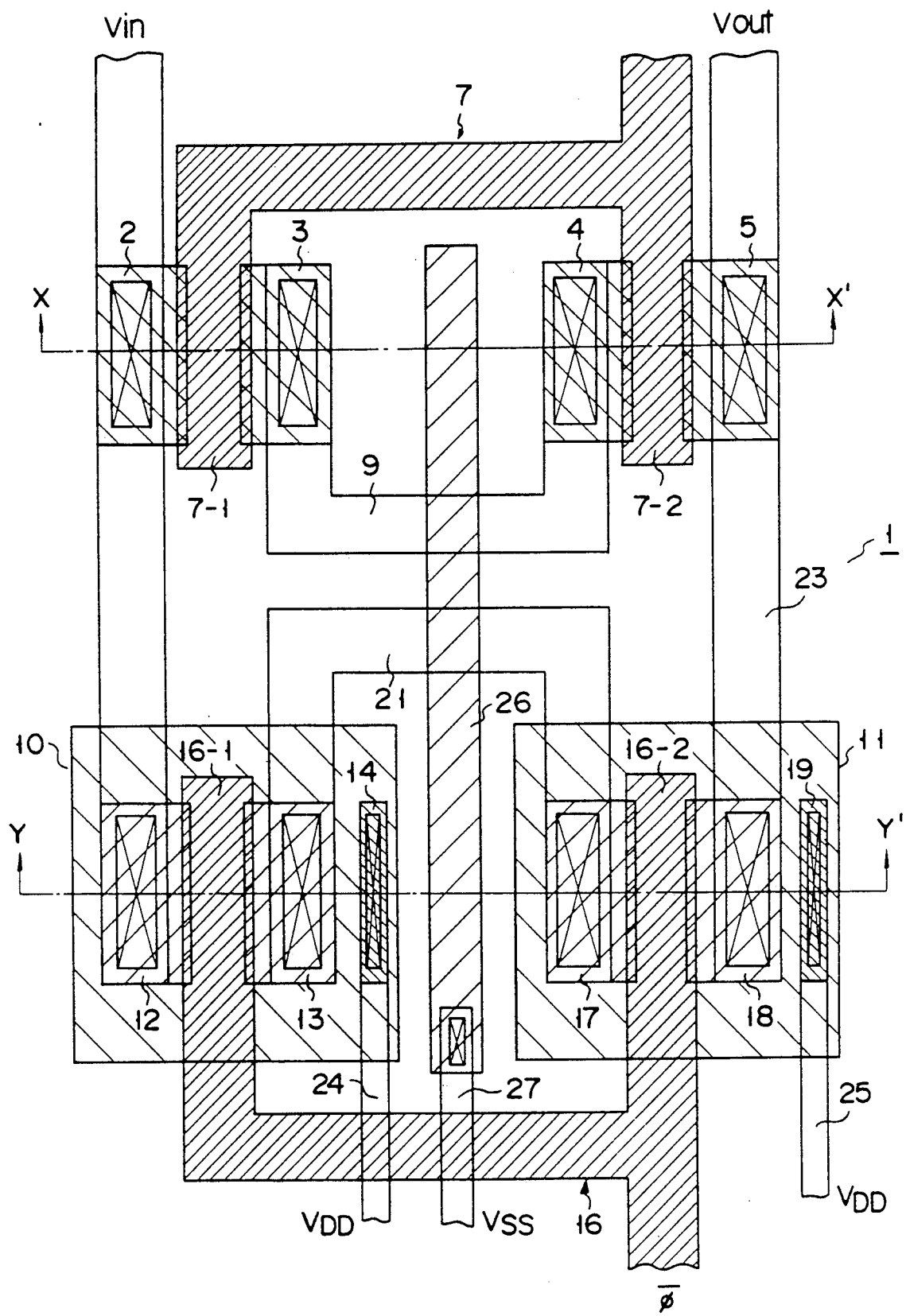
FIG. 5A is a plan view showing a pattern of the transfer gate structured as shown in FIG. 3, the transfer gate being according to a second embodiment of the present invention.

FIG. 5A is a plan view showing a pattern of the transfer gate structured as shown in FIG. 3, the transfer gate being according to a second embodiment of the present invention. FIG. 5B is a sectional view taken on line X-X' in FIG. 5A. FIG. 5C is a sectional view taken on line Y-Y' in FIG. 5A. In the illustration of FIGS. 5B and 5C, the structure of the MOS FETs is elaborated, but the wires on the upper layers are indicated by mere solid lines, for simplicity. Further, in FIGS. 5A to 5C, like or equivalent portions are designated by like reference symbols in FIGS. 4A to 4C, for the same purpose.

As shown, in the major surface region of the substrate 1, a p+diffusion layer 26 of the same conductivity type as that of the substrate 1 and with a higher impurity concentration than that of the substrate 1 is formed at a location between the well region 10 and the well region 11. The diffusion layer 26 is connected to a ground point $V_{SS}$ by means of a wire 27.

In the transfer gate thus structured, the diffusion layer 26 connected to the ground point $V_{SS}$ exists in the leak current path between the well regions 10 and 11. Because of this structural feature, the leak current flow from the well region 10 to the well region 11 can be shut off. With the physical properties of the diffusion layer, e.g., high impurity concentration, the effective distance between the well regions 10 and 11 is remarkably increased. In this respect, if the geometrical distance between them of the transfer gate in this or second embodiment is equal to that of the transfer gate of the first embodiment the second embodiment can more reliably separate the well regions 10 and 11 from each other than the first embodiment. This feature contributes to improvement of the device reliability. When taking into consideration an integration density and the leak current shut-off characteristic, preferable geometrics are: 6 μm for the width $\Delta W1$ of the diffusion layer 26, and 4 to 5 μm for the distance $\Delta W2$ between the diffusion layer 26 and the well region 10 and the distance between the diffusion layer 26 and the well region 11.

Figure 6:
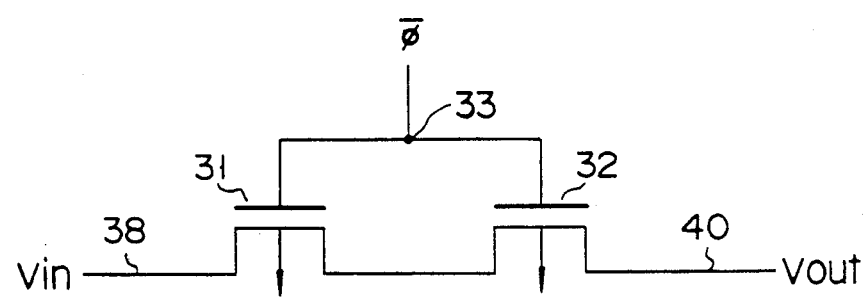
FIG. 6 is a circuit diagram showing a transfer gate according to a third embodiment of the present invention.

While the transfer gate of the CMOS structure have been described in the first and second embodiments, an alternative as shown in FIG. 6 is allowed within the scope of the present invention. In the alternative of FIG. 6, a couple of p-channel MOS FETs 31 and 32 are coupled in series with each other. The structure of each FETs 31 and 32 may be the same as that of the FET illustrated in FIGS. 4A through 4C or FIGS. 5A through 5C.

As already stated, the FETs having the depletion layer capacitor problem are only the p-channel MOS FETs 31 and 32. Therefore, the arrangement of FIG. 6 may have the advantageous effects like those of the first and second embodiments.

In the embodiments as mentioned above, the number of the MOS FETs (31, 32; 34, 35) connected together in series is only two, but it may be three or more. Use of an increased number of FETs ensures a more perfect attenuation of the signal propagating through the transfer gate.

As seen from the foregoing description, in a situation that the transfer gate is in an off state, a high voltage above the rated voltage is applied to the transfer ate, and under this condition an alternately varying signal or noise is applied to the transfer gate, the transfer gate according to the present invention can inhibit a voltage variation at the input node of the gate from propagating through the transfer gate and reaching the output node. Accordingly, the transfer ate according to the present invention is reliable, and when it is applied to an analog switch of the MOS-IC, the analog switch is also reliable.

What is claimed is:

1. A transfer gate comprising:
    a semiconductor substrate of a first conductivity type;
    a plurality of well regions of a second conductivity type formed in a major surface region of said semiconductor substrate at different locations separated from each other by predetermined distances;
    an input node to which a signal is supplied;
    an output node for outputting the signal supplied through the input node to an analog circuit;
    a plurality of MOS FETs of the first conductivity type formed in the major surface region of the semiconductor substrate and connected in series to form a current path, one end of said current path being connected to the input node, another end of said current path being connected to the output node, and a first common control signal being supplied to gates of said MOS FETs for on/off control; and
    a plurality of MOS FETs of the second conductivity type formed in the well regions and connected in series to form a current path, one end of said current path being connected to the input node, the other end of said current path being connected to the output node, and a second common control signal opposite in phase to the first common control signal being supplied to the gates of said MOS FETs for the on/off control.

2. The transfer gate according to claim 1, further comprising an impurity region of the first conductivity type which is formed in the major surface region of said semiconductor substrate at a location between said well regions, said impurity region having an impurity concentration higher than said semiconductor substrate, being coupled for reception with ground potential, and electrically isolating said well regions one from the other.

3. The transfer gate according to claim 1, further comprising a sub-region of the second conductivity type formed in each of said plurality of well regions, said sub-regions having an impurity concentration higher than said well regions and being coupled for reception with a power source potential.

4. The transfer gate according to claim 1, in which said first conductivity type is a p-type, and said second conductivity type is an n-type.

* * * * *

UNITED STATES PATENT AND TRADEMARK OFFICE
CERTIFICATE OF CORRECTION

PATENT NO. : 5,023,688
DATED : June 11, 1991
INVENTOR(S) : Kazumasa Ando et al.

It is certified that error appears in the above-identified patent and that said Letters Patent is hereby corrected as shown below:

On the title page, item [75] Inventors:

The first name of the first inventor should read --Kazumasa--.

The last name of the second inventor should read --Sakai--.

Signed and Sealed this

Thirteenth Day of April, 1993

Attest:

STEPHEN G. KUNIN

Attesting Officer

Acting Commissioner of Patents and Trademarks